US006133057A

United States Patent [19]

Derraa

[11] Patent Number: 6,133,057

[45] Date of Patent: Oct. 17, 2000

[54] METHOD OF FABRICATING FIELD EMISSION ARRAYS EMPLOYING A HARD MASK TO DEFINE COLUMN LINES AND ANOTHER MASK TO DEFINE EMITTER TIPS AND RESISTORS

[75] Inventor: Ammar Derraa, Boise, Id.

[73] Assignee: Micron Technology, Inc., Boise, Id.

[21] Appl. No.: 09/472,571

[22] Filed: Dec. 27, 1999

Related U.S. Application Data

[63] Continuation of application No. 09/260,214, Mar. 1, 1999.

[51] Int. Cl.[7] .................... H01L 21/00

[52] U.S. Cl. .................... 438/20; 445/49; 445/50; 445/51

[58] Field of Search .................... 438/20; 445/49, 445/50, 51

[56] References Cited

U.S. PATENT DOCUMENTS

| | | |
|---|---|---|
| 5,229,331 | 7/1993 | Doan et al. . |
| 5,302,238 | 4/1994 | Roe et al. . |
| 5,312,514 | 5/1994 | Kumar . |
| 5,329,207 | 7/1994 | Cathey et al. . |
| 5,372,973 | 12/1994 | Doan et al. . |
| 5,374,868 | 12/1994 | Tjaden et al. . |
| 5,585,301 | 12/1996 | Lee et al. . |
| 5,633,560 | 5/1997 | Huang . |
| 5,637,023 | 6/1997 | Itoh et al. . |
| 5,641,706 | 6/1997 | Tjaden et al. . |
| 5,669,801 | 9/1997 | Lee . |
| 5,696,385 | 12/1997 | Song et al. . |
| 5,711,694 | 1/1998 | Levine et al. . |
| 5,712,534 | 1/1998 | Lee et al. . |
| 5,735,721 | 4/1998 | Choi . |
| 5,895,580 | 4/1999 | Liu et al. .................... 216/11 |
| 5,965,218 | 10/1999 | Bothra et al. .................... 427/578 |
| 6,012,958 | 1/2000 | Tjaden et al. .................... 445/24 |
| 6,017,772 | 1/2000 | Derraa .................... 438/20 |

*Primary Examiner*—Matthew Smith
*Assistant Examiner*—Robert A. Hullinger
*Attorney, Agent, or Firm*—Trask Britt

[57] ABSTRACT

A method of fabricating a field emission array that employs a single mask to define the emitter tips thereof and their corresponding resistors. A layer of conductive material is disposed over a substrate of the field emission array. A plurality of substantially mutually parallel conductive lines is defined from the layer of conductive material. At least one layer of semiconductive material or conductive material is disposed over the conductive lines and over the regions of the substrate exposed between adjacent conductive lines. A mask material is disposed over the layer of semiconductive material or conductive material, substantially above each of the conductive lines. Portions of the layer of semiconductive material or conductive material exposed through the mask material may be removed to expose substantially longitudinal center portions of the conductive lines. Other portions of the layer of semiconductive material or conductive material may remain over peripheral lateral edges of the conductive lines. The mask material may be removed and the layer of semiconductive material or conductive material planarized. A mask is disposed over the field emission array and portions of the layer of semiconductive material or conductive material removed therethrough to define emitter tips and their corresponding resistors. The substantially longitudinal center portion of each of the conductive lines may be removed to electrically isolate adjacent columns of pixels of the field emission array from each other. Field emission arrays fabricated by the method of the present invention are also within the scope of the present invention.

59 Claims, 6 Drawing Sheets

METHOD OF FABRICATING FIELD EMISSION ARRAYS EMPLOYING A HARD MASK TO DEFINE COLUMN LINES AND ANOTHER MASK TO DEFINE EMITTER TIPS AND RESISTORS

CROSS REFERENCE TO RELATED APPLICATION

This application is a continuation of application Ser. No. 09/260,214, filed Mar. 1, 1999, pending.

BACKGROUND OF THE INVENTION

1. Field of the Invention

The present invention relates to methods of fabricating field emission arrays. Particularly, the present invention relates to field emission array fabrication methods wherein the emitter tips and their corresponding resistors are fabricated through a single mask. More particularly, the present invention relates to field emission array fabrication methods that employ only one mask to define the emitter tips and their corresponding resistors and that do not require a mask to define the column lines thereof.

2. Background of the Related Art

Typically, field emission displays ("FEDs") include an array of pixels, each of which includes one or more substantially conical emitter tips. The array of pixels of a field emission display is typically referred to as a field emission array. Each of the emitter tips is electrically connected to a negative voltage source by means of a cathode conductor line, which is also typically referred to as a column line.

Another set of electrically conductive lines, which are typically referred to as row lines or as gate lines, extends over the pixels of the field emission array. Row lines typically extend across a field emission display substantially perpendicularly to the direction in which the column lines extend. Accordingly, the paths of a row line and of a column line typically cross proximate (above and below, respectively) the location of an emitter tip. The row lines of a field emission array are electrically connected to a relatively positive voltage source. Thus, as a voltage is applied across the column line and the row line, electrons are emitted by the emitter tips and accelerated through an opening in the row line.

As electrons are emitted by emitter tips and accelerate past the row line that extends over the pixel, the electrons are directed toward a corresponding pixel of a positively charged electro-luminescent panel of the field emission display, which is spaced apart from and substantially parallel to the field emission array. As electrons impact a pixel of the electro-luminescent panel, the pixel is illuminated. The degree to which the pixel is illuminated depends upon the number of electrons that impact the pixel.

Numerous techniques have been employed to fabricate field emission arrays and the resistors thereof. An exemplary field emission array fabrication technique includes fabricating the column lines and emitter tips prior to fabricating a dielectric layer and the overlying grid structure, such as by the methods of U.S. Pat. No. 5,302,238, issued to Fred L. Roe et al. on Apr. 12, 1994, and U.S. Pat. No. 5,372,973, issued to Trung T. Doan et al. on Dec. 13, 1994. Alternatively, a field emission array may be fabricated by forming the dielectric layer and the overlying grid structure, then disposing material over the grid structure and into openings therethrough to form the emitter tips, such as by the technique disclosed by U.S. Pat. No. 5,669,801, issued to Edward C. Lee on Sep. 23, 1997. Such conventional field emission array fabrication methods typically require the use of masks to independently define the various features, such as the column lines, resistors, and emitter tips, thereof.

Another exemplary method of fabricating field emission arrays is taught in U.S. Pat. No. 5,374,868 (hereinafter "the '868 Patent"), issued to Kevin Tjaden et al. on Dec. 20, 1994. The fabrication method of the '868 Patent includes defining trenches in a substrate. The trenches correspond substantially to columns of pixels of the field emission array. A layer of insulative material is disposed over the substrate, including in the trenches thereof. A layer of conductive material and a layer of cathode material (e.g., polysilicon) are sequentially disposed over the layer of insulative material. A mask may then be disposed over the layer of cathode material and the emitter tips and their corresponding column lines defined through the cathode material and "highly conductive" material layers, respectively. The method of the '868 Patent is, however, somewhat undesirable in that the mask thereof is not also employed to fabricate resistors, which limit high current and prevent device failure. Moreover, in the embodiment of the method of the '868 Patent that employs a single mask to fabricate both the emitter tips and their corresponding column lines, neither the "highly conductive" material nor the cathode material is planarized. Thus, the layer of cathode material may have an uneven surface and the heights of the emitter tips defined therein may vary substantially. In embodiments of the method of the '868 Patent where the layer of "highly conductive" material is planarized, only the emitter tips are defined through the mask.

Accordingly, there is a need for a field emission array fabrication process that employs a minimal number of mask steps to define emitter tips of substantially uniform height, their corresponding resistors, and their corresponding column lines.

SUMMARY OF THE INVENTION

The present invention includes a method of fabricating the pixels of a field emission array and, in particular, defining emitter tips and their corresponding resistors by employing a single mask. The field emission array fabrication method of the present invention may also include electrically isolating adjacent column lines from one another with requiring the use of an additional mask. Field emission arrays fabricated in accordance with the inventive method are also within the scope of the present invention.

The method of the present invention includes defining a plurality of substantially mutually parallel conductive lines on a substrate. In order to define the conductive lines, a layer of conductive material may be deposited onto the substrate. The conductive lines may be defined from the conductive layer by known processes. Alternatively, conductive material may be selectively deposited onto the substrate, as known in the art, to define the conductive lines.

One or more layers of semiconductive material or conductive material, from which the emitter tips and their corresponding resistors of the field emission array will be defined, may be disposed over each of the conductive lines and over the regions of the substrate that are exposed between adjacent conductive lines. The layer or layers of semiconductive material or conductive material are also referred to herein as the emitter tip-resistor layer or as the emitter tip layer and resistor layer, respectively. The emitter tip and resistor layer or layers may be disposed over the conductive lines and the substrate by known processes and in a thickness that corresponds to a desired height of the emitter tips and their corresponding resistors. As each of the conductive lines protrudes somewhat from the surface of the substrate, a cross section of the emitter tip and resistor layer or layers has a peak and valley appearance. The peaks of the emitter tip and resistor layer or layers are disposed substantially above the conductive lines, while the valleys of the emitter tip and resistor layer or layers are disposed substantially between adjacent column lines. Due to this peak and valley appearance, if the emitter tip and resistor layer or layers are planarized, the height of the emitter tips and the resistors are defined somewhat by the relative heights of the conductive lines and the thickness of material remaining above the conductive lines following planarization.

A layer of mask material may be disposed over the emitter tip and resistor layer or layers. Such a mask material may be removed from substantially above the conductive lines (i.e., from above the "peaks") by known processes to define a so-called "hard mask" from the remaining mask material (i.e., the regions located in the "valleys"). Upon exposure of regions of the emitter tip and resistor layer or layers, regions of the emitter tip and resistor layer or layers disposed above the substantially longitudinal center portion of each of the conductive lines may be substantially removed by known processes to expose the substantially longitudinal center portion of the conductive lines. Exemplary processes that may be employed to remove material from these regions of the emitter tip and resistor layer or layers include, without limitation, the use of etchants that are selective for the material or materials of the emitter tip and resistor layer or layers over the mask material.

The emitter tip and resistor layer or layers may be planarized by known processes, such as by chemical-mechanical planarization ("CMP"). Upon such planarization, the peaks and possibly portions of the valleys proximate the surface of the uppermost layer of semiconductive material or conductive material are removed and a substantially planar surface is formed.

The emitter tips and resistors of the field emission array may be defined through the remaining portions of the emitter tip and resistor layer or layers by disposing a mask over the exposed surface of the field emission array and defining apertures therethrough in locations to facilitate the selective removal of portions of the emitter tip and resistor layer or layers through the apertures in order to define the emitter tips and resistors. The mask may be disposed upon the field emission array by known processes, such as by the use of a photoresist material and by exposing and developing selected regions of the photoresist material to define the mask and the apertures therethrough. The emitter tips and resistors may be defined by known processes, such as by the use of etchants for the material or materials of the emitter tip and resistor layer or layers. Preferably, as regions of the emitter tip and resistor layer or layers are removed from the substantially longitudinal center portion of each of the conductive lines and as the emitter tips and resistors are defined, at least a lateral edge of the conductive lines remains covered with a material of the emitter tip and resistor layer or layers.

Adjacent columns of pixels of the field emission array may be electrically isolated from each other by removing at least the substantially longitudinal center portion of each of the conductive lines. An etchant that is selective for the conductive material of the conductive lines over the material or materials of the emitter tip and resistor layer or layers may be employed to remove conductive material from the substantially longitudinal center of each of the conductive lines and, thereby, to define the column lines and to electrically isolate adjacent column lines from one another.

The present invention also includes field emission arrays that have been fabricated in accordance with the method of the present invention. Thus, a field emission array according to the present invention may include a substrate with at least one resistor thereon, at least one lateral conductive layer, or column line, laterally adjacent the resistor, and at least one emitter tip disposed on the resistor. The substrate of the field emission array is exposed between adjacent column lines.

Other features and advantages of the present invention will become apparent to those of skill in the art through a consideration of the ensuing description, the accompanying drawings, and the appended claims.

DETAILED DESCRIPTION OF THE INVENTION

Figure 1:
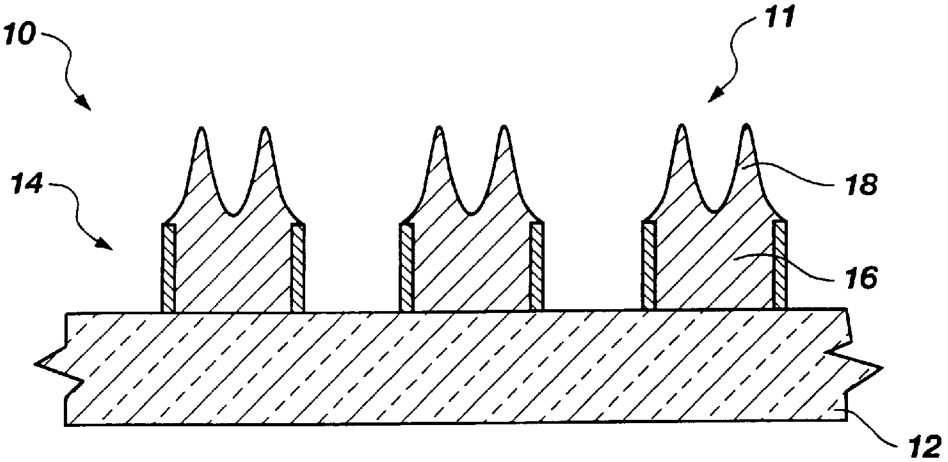
FIG. 1 is a cross-sectional schematic representation of a field emission array that may be fabricated in accordance with the method of the present invention.

With reference to FIG. 1, a field emission array 10 is illustrated. Field emission array 10 includes a substrate 12 upon which various features of field emission array 10, including the column lines 14, resistors 16, and emitter tips 18 thereof may be fabricated. A pixel 11 of field emission array 10 may include one or more emitter tips 18 and their associated, underlying resistor 16 or resistors. Each resistor 16 and its associated emitter tip 18 may be connected to, or otherwise in communication with, a relatively negative voltage source by means of one or more column lines 14, or lateral conductive layer, which are preferably disposed laterally adjacent a corresponding resistor 16.

Figure 2:
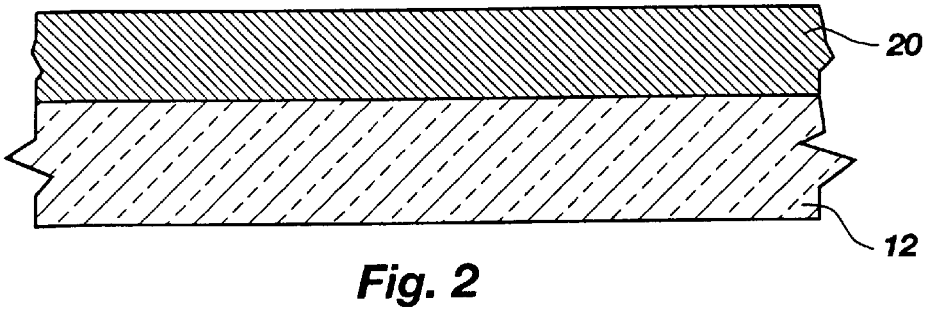
FIG. 2 is a schematic cross-sectional representation of the field emission array of FIG. 1, illustrating the blanket disposition of a layer of conductive material over a surface of a substrate.

With reference to FIG. 2, materials that may be employed as substrate 12 in the present invention include, without limitation, silicon, gallium arsenide, other semiconductive materials, silicon wafers, wafers of other semiconductive materials, silicon on glass ("SOG"), silicon on insulator ("SOI"), silicon on sapphire ("SOS"), and bare glass.

With continued reference to FIG. 2, a layer 20 of conductive material is disposed over substrate 12. Conductive materials, such as doped silicon, polysilicon, doped polysilicon, chromium, aluminum, molybdenum, copper, or other metals, may be employed as layer 20. The conductive material of layer 20 may be disposed over substrate 12 by known processes, such as by physical vapor deposition ("PVD") (e.g., sputtering) or by chemical vapor deposition ("CVD") (e.g., low pressure CVD ("LPCVD"), atmospheric pressure CVD ("APCVD"), or plasma-enhanced CVD ("PECVD")) processes. Layer 20 may be blanket deposited over substrate 12 or selectively deposited thereover.

Figure 3:
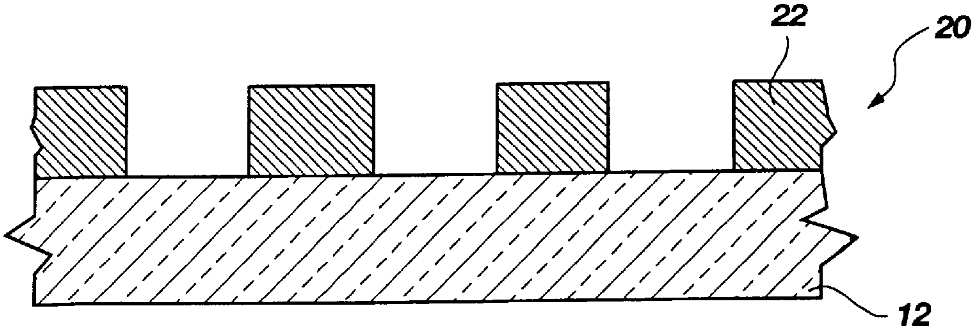
FIG. 3 is a schematic cross-sectional representation of the field emission array of FIG. 2, illustrating patterning of the layer of conductive material to define substantially mutually parallel conductive lines over the substrate.
Figure 3A:
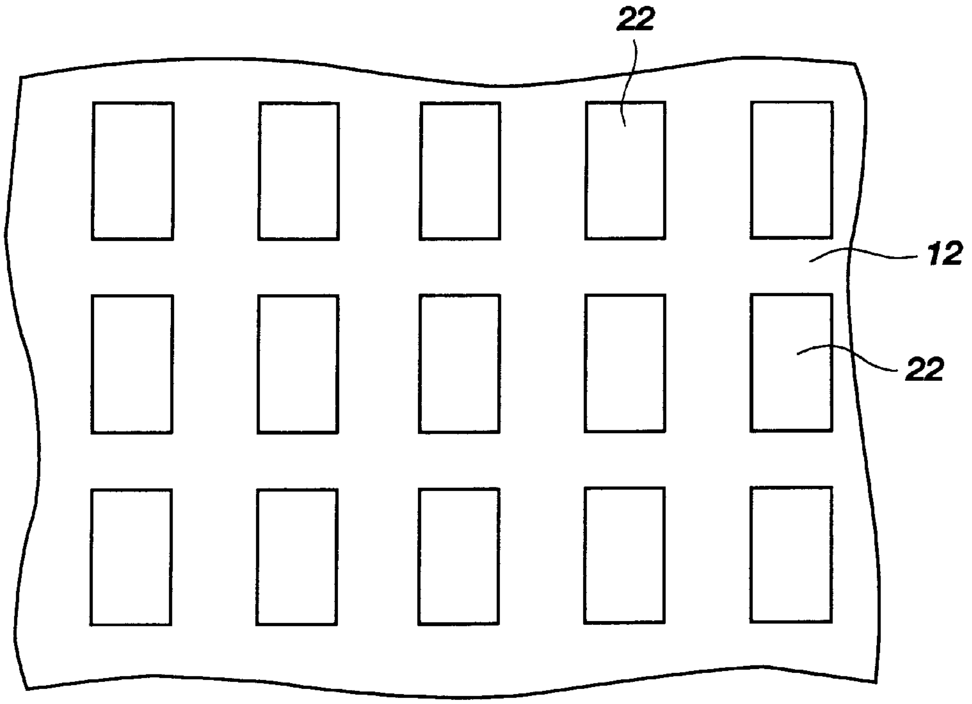
FIG. 3A is a schematic top view of the field emission array of FIG. 3.

With reference to FIGS. 3 and 3A, if layer 20 is blanket deposited over substrate 12, layer 20 may be patterned by known processes, such as by masking and etching techniques, to define substantially mutually parallel conductive lines 22 therefrom. If layer 20 is selectively deposited, the substantially mutually parallel conductive lines 22 may be fabricated during deposition of the conductive material of layer 20.

Figure 4:
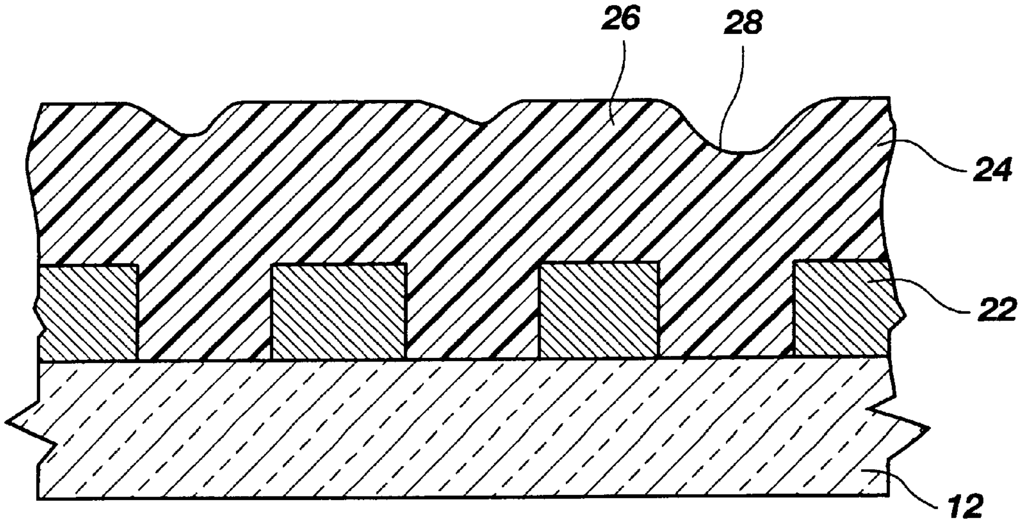
FIG. 4 is a schematic cross-sectional representation of the field emission array of FIG. 3, illustrating the disposition of an emitter tip-resistor layer over exposed portions of the substrate and over the substantially mutually parallel conductive lines.

Turning now to FIG. 4, a layer 24 of semiconductive material or conductive material, which is also referred to herein as a second layer or as an emitter tip-resistor layer, is disposed over conductive lines 22 and the regions of substrate 12 that are exposed between adjacent conductive lines 22. Since conductive lines 22 protrude somewhat from substrate 12 and layer 24 is disposed thereover in a substantially consistent thickness, layer 24 has a peak and valley appearance, with peaks 26 being located above conductive lines 22 and valleys 28, which are also referred to herein as depressions, being located between adjacent conductive lines 22.

Exemplary semiconductive materials that may be employed as layer 24 include, without limitation, single-crystalline silicon, amorphous silicon, polysilicon, and doped polysilicon. These materials may be deposited as known in the art, such as by chemical vapor deposition ("CVD") techniques. Of course, conductive materials having the desired properties and that are useful in fabricating emitter tips 18 and resistors 16 may also be employed in layer 24 and may be disposed over conductive lines 22 and the exposed regions of substrate 12 by known processes.

Figure 4A:
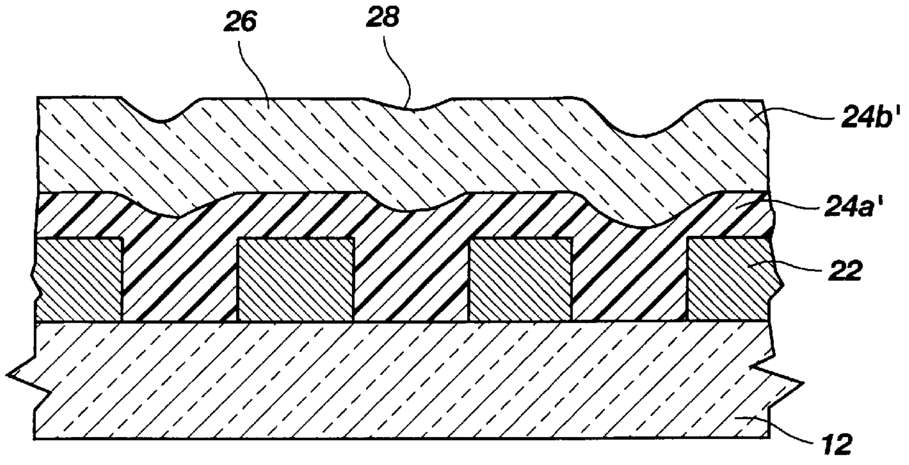
FIG. 4A is a schematic cross-sectional representation of a variation of the field emission array of FIG. 4, wherein the emitter tip-resistor layer comprises a layer of resistor material and a layer of emitter tip material disposed over the layer of resistor material.

Alternatively, it may be desirable to fabricate emitter tips 18 and resistors 16 from different semiconductive materials or conductive materials. For example, it may be desirable to fabricate resistors 16 from polysilicon, while a material such as single-crystalline silicon or amorphous silicon may be more desirable for fabricating emitter tips 18. Accordingly, with reference to FIG. 4A, a variation of the field emission array may include a resistor layer 24$a'$ and an emitter tip layer 24$b'$. Resistor layer 24$a'$ is disposed over conductive lines 22 and the regions of substrate 12 exposed between adjacent conductive lines 22. Emitter tip layer 24$b'$ is disposed over resistor layer 24$a'$. As with layer 24 of FIG. 4, resistor layer 24$a'$ and emitter tip layer 24$b'$ may each have a peak and valley configuration.

Figure 5:
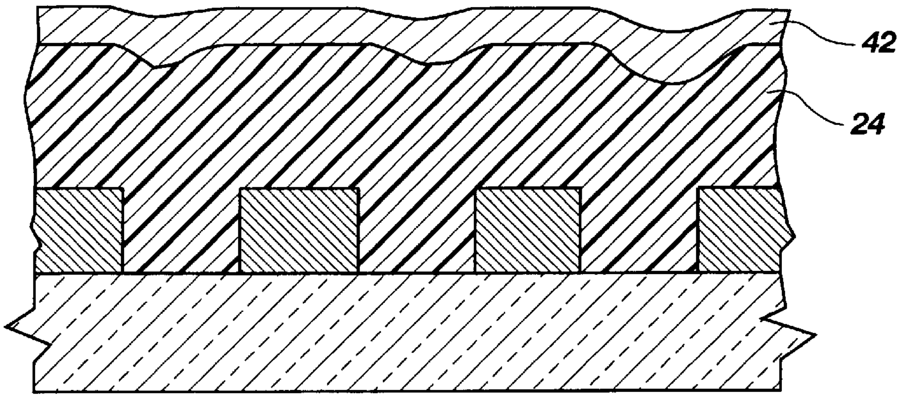
FIG. 5 is a schematic cross-sectional representation of the field emission array of FIG. 4, illustrating the disposition of a mask layer over the emitter tip-resistor layer.

Turning now to FIG. 5, a mask layer 42 of mask material may be disposed over emitter tip-resistor layer 24. Preferably, the material or materials of emitter tip-resistor layer 24 are selectively etchable with respect to the mask material. Accordingly, materials such as metals, metal oxides, silicon oxides, doped silicon oxides (e.g., borophosphosilicate glass ("BPSG"), phosphosilicate glass ("PSG"), borosilicate glass ("BSG"), etc.), or silicon nitrides may be employed as the mask material. Mask layer 42 may be disposed upon emitter tip-resistor layer 24 by known processes, such as by physical vapor deposition ("PVD"), chemical vapor deposition ("CVD"), growing the mask material onto the surface of emitter tip-resistor layer 24, or spinning the mask material thereon, depending upon the type of mask material employed.

Figure 6:
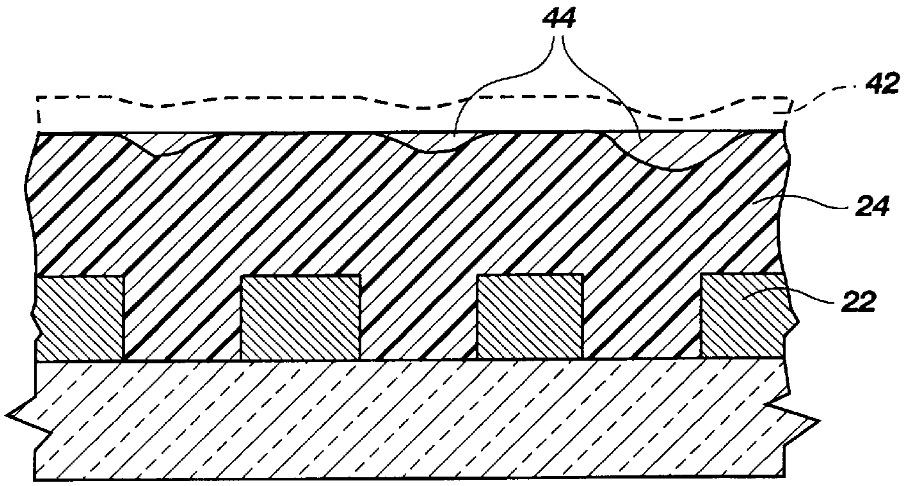
FIG. 6 is a schematic cross-sectional representation of the field emission array of FIG. 5, illustrating the removal of regions of the mask layer disposed substantially above the conductive lines to define a hard mask from the mask layer.

Referring now to FIG. 6, a so-called "hard mask" 44 may be formed on emitter tip-resistor layer 24 by removing the regions of mask layer 42 that are disposed substantially between conductive lines 22. These regions of mask layer 42 may be removed by known processes, such as by known planarization techniques, such as by the chemical-mechanical planarization ("CMP") or chemical-mechanical polishing techniques taught in U.S. Pat. Nos. 4,193,226 and 4,811,522, the disclosures of both of which are hereby incorporated in their entireties by reference. As hard mask 44 is formed, the portions of emitter tip-resistor layer 24 that are disposed substantially above at least the substantially longitudinal center portion of conductive lines 22 are exposed through mask 44.

Figure 7:
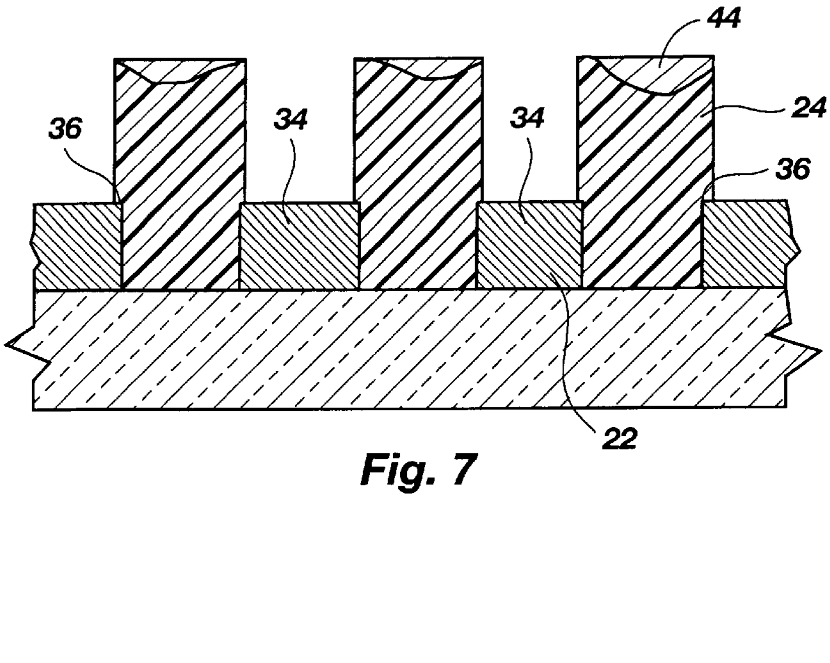
FIG. 7 is a schematic cross-sectional representation of the field emission array of FIG. 6, from which portions of the emitter tip-resistor layer disposed over the conductive lines have been removed through the hard mask.

FIG. 7 illustrates the removal of portions of emitter tip-resistor layer 24 that are exposed through hard mask 44 and the exposure of at least substantially longitudinal center portions 34 of conductive lines 22 through emitter tip-resistor layer 24. Preferably, the removal of these substantially longitudinal center portions 34 of emitter tip-resistor layer 24 is substantially anisotropic. The material or materials of the exposed portions of emitter tip-resistor layer 24 may be removed by known processes, such as by the use of etchants that are selective for one or more materials of emitter tip-resistor layer 24 over the mask material of hard mask 44. Preferably, at least a peripheral lateral edge portion 36 of selected column lines 22 remains covered by emitter tip-resistor layer 24 so as to facilitate the subsequent removal of only a portion of the selected conductive lines 22.

The use of a hard mask facilitates isolation of adjacent pixels independent of the heights of emitter tips 18 and resistors 16 (see FIG. 1). Accordingly, when such a hard mask 44 is employed, the relative heights of emitter tips 18 and resistors 16 are not determined by the height of conductive lines 22, as would be the case if conductive lines 22 were exposed during the definition of emitter tips 18 and resistors 16 (i.e., resistors 16 need not have substantially the same height as conductive lines 22).

Figure 8:
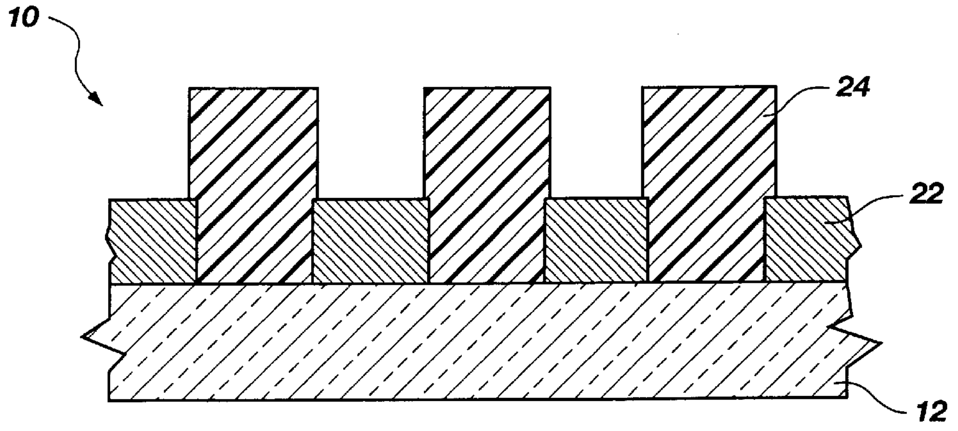
FIG. 8 is a schematic cross-sectional representation of the field emission array of FIG. 7, with the hard mask removed therefrom and illustrating planarization of the emitter tip-resistor layer.

Hard mask 44 may be removed from emitter tip-resistor layer 24 by known techniques, such as planarization processes (e.g., CMP) or the use of etchants that etch the material of hard mask 44 with selectivity over the material or materials of emitter tip-resistor layer 24. FIG. 8 illustrates field emission array 10 with the hard mask removed therefrom.

As shown in FIG. 8, the peaks 26 (see FIGS. 4 and 4A) and possibly portions of valleys 28 (see FIGS. 4 and 4A) have been substantially removed from the exposed surface of layer 24 during the definition and/or removal of hard mask 44 (see FIGS. 6 and 7) therefrom. Layer 24 may be planarized by known processes, such as CMP.

Figure 8A:
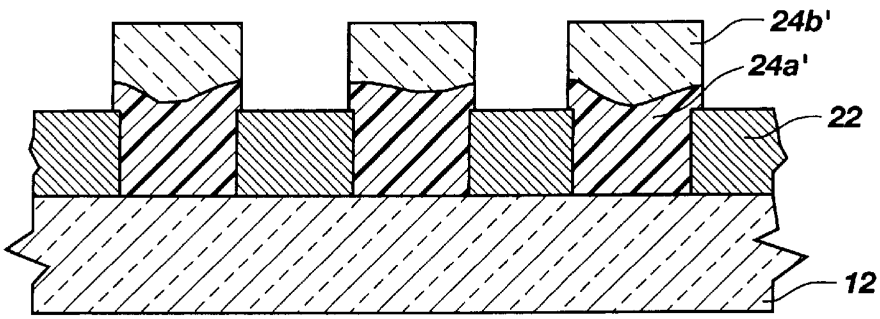
FIG. 8A is a schematic cross-sectional representation of the field emission array of FIG. 4A, from which portions of the emitter tip-resistor layer disposed above the conductive lines have been removed, and the remaining surface of the emitter tip layer has been planarized.

With reference to FIG. 8A, if emitter tip layer 24*b*' (see FIG. 4A) is planarized, such as by known chemical-mechanical planarization techniques, the portions of emitter tip layer 24*b*' that remain between adjacent conductive lines 22 preferably have a thickness that is sufficient to fabricate emitter tips 18 (see FIG. 1) of a desired height therefrom.

Figure 9:
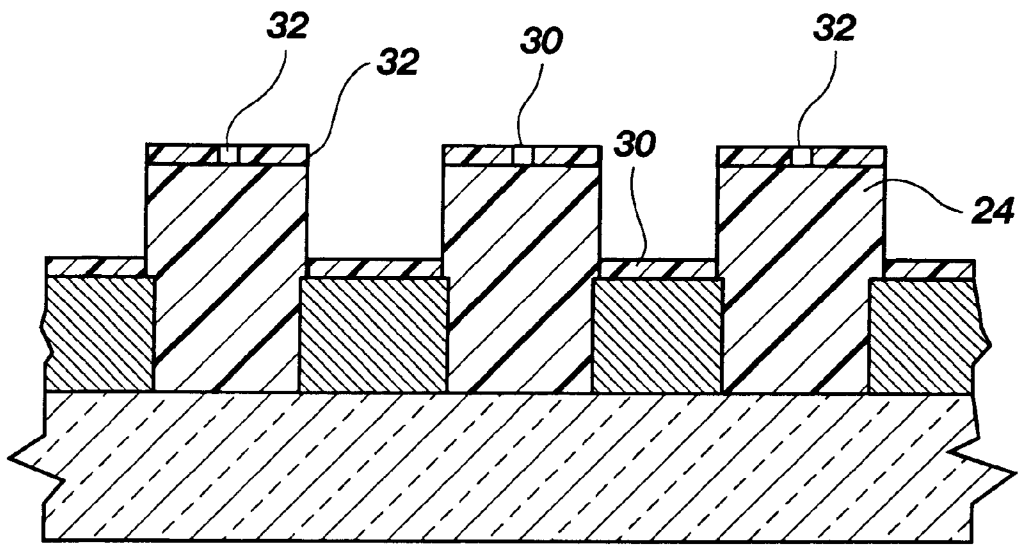
FIG. 9 is a schematic cross-sectional representation of the field emission array of FIG. 8, illustrating the disposition of a mask over the emitter tip-resistor layer.

Referring now to FIG. 9, the remainder of layer 24 may be patterned by disposing a mask 30 thereover and selectively removing portions of layer 24 through mask 30. Known techniques may be employed to dispose mask 30 over layer 24, and possibly over the exposed regions of conductive lines 22, such as disposing a layer of photoresist material over layer 24, and exposing and developing selected regions of the photoresist material to define apertures 32 therethrough in desired locations.

Figure 10:
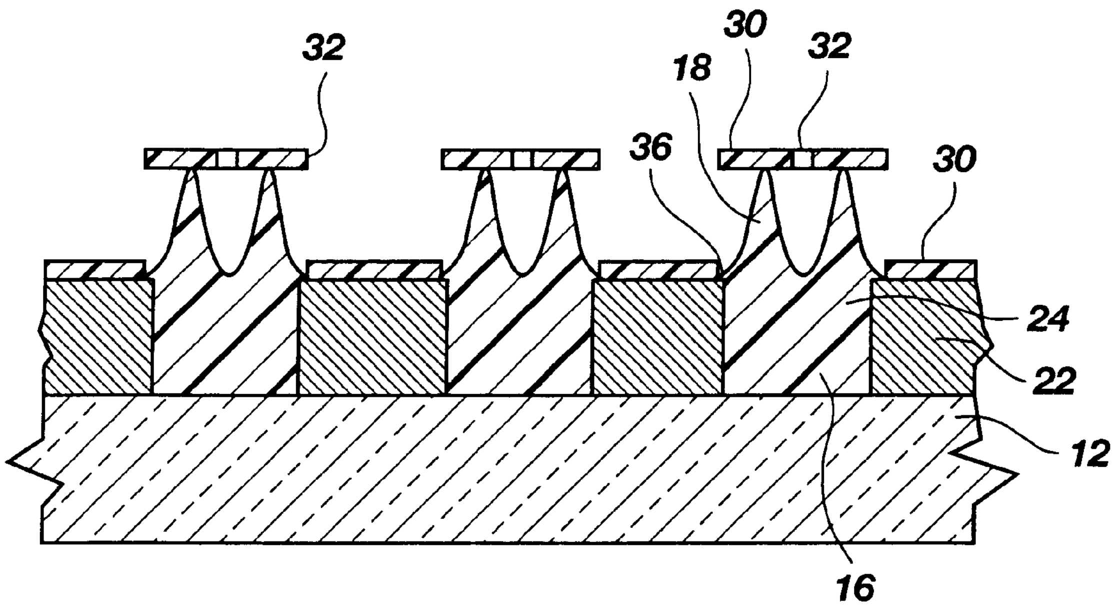
FIG. 10 is a schematic cross-sectional representation of the field emission array of FIG. 9, illustrating patterning of the emitter tip-resistor layer through apertures of the mask.

Turning now to FIG. 10, selected portions of the remainder of layer 24 may be removed through apertures 32 of mask 30 by known techniques, such as etching, to define emitter tips 18 and resistors 16. Either wet etching processes or dry etching processes may be employed. As emitter tips 18 may be conically shaped, the use of isotropic etching techniques is preferred. For example, if either single-crystalline or amorphous silicon is employed to fabricate emitter tips 18 (i.e., if these materials are employed as layer 24), wet etchants, such as mixtures of nitric acid ($HNO_3$) and hydrofluoric acid (HF), may be employed in known wet etch processes to remove material from selected regions of layer 24. As the exposure of conductive lines 22 through layer 24 and the definition of emitter tips 18 and resistors 16 from layer 24 may be effected through a single mask, each of these processes is said to occur substantially simultaneously for purposes of this disclosure. Preferably, as layer 24 is patterned, the material of layer 24 is not removed from (i.e., is maintained over) at least one peripheral edge portion 36 of each of conductive lines 22.

If mask 30 or portions thereof remain following the definition of emitter tips 18 and resistors 16, mask 30 may be removed from the surface of field emission array 10 by known processes. Any etchants may also be removed from field emission array 10 by known processes, such as by washing field emission array 10.

Figure 11:
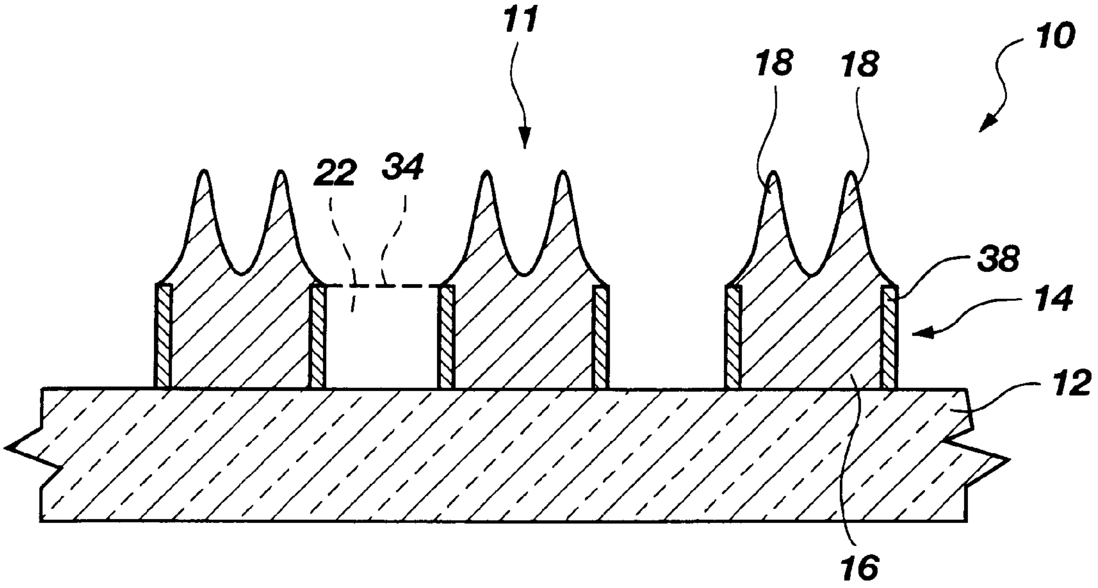
FIG. 11 is a schematic cross-sectional representation of the field emission array of FIG. 10, illustrating the definition of column lines and the electrical isolation of adjacent columns of pixels by removing a substantially longitudinal center portion of each of the conductive lines.

FIG. 11 depicts field emission array 10 following the removal of the conductive material of at least the substantially longitudinal center portion 34 of each conductive line 22. The conductive material of substantially longitudinal center portion 34 is substantially removed such that the underlying regions of substrate 12 are exposed and a lateral conductive layer 38 remains laterally adjacent each resistor 16.

Each column line 14 preferably comprises a lateral edge portion 36 that remains from at least one of the conductive lines 22 that was previously adjacent the resistor 16. The remaining lateral edge portion 36 of a patterned conductive line 22, which is preferably disposed laterally adjacent its associated resistor 16, is also referred to herein as a lateral conductive layer 38. Preferably, each column line 14 includes two lateral conductive layers 38 with at least one resistor 16 disposed therebetween.

Thus, as conductive lines 22 are patterned, column lines 14 are formed and adjacent columns of pixels 11 or emitter tips 18 are substantially electrically isolated from each other. If an etchant or etchants are employed to pattern conductive lines 22, any remaining etchants may be removed from field emission array 10 after the desired patterning has been performed. Etchants may be removed by known processes, such as by washing field emission array 10.

The conductive material of substantially longitudinal center portion 34 of conductive lines 22 may be removed therefrom by known processes, such as by known etching techniques. While either dry etching or wet etching techniques may be employed to pattern conductive lines 22, substantially anisotropic etching of conductive lines 22 is preferred so as to facilitate the formation of lateral conductive layers 38 of substantially uniform thickness. For example, if conductive lines 22 comprise polysilicon, a dry etchant, such as a chlorine etchant, a fluorine etchant, or a combination thereof (e.g., $SF_6$ and $Cl_2$), may be employed in a dry etch process, such as glow-discharge sputtering, ion milling, reactive ion etching ("RIE"), reactive ion beam etching ("RIBE"), or high-density plasma etching.

Conductive lines 22 may be patterned at any point when substantially longitudinal center portions 34 are exposed. For example, conductive lines 22 may be patterned prior to disposing layer 24 onto substrate 12, after conductive lines 22 are exposed through layer 24, or after emitter tips 18 and resistors 16 are defined.

The method of the present invention requires fewer fabrication steps than conventional field emission array fabrication processes. Accordingly, the method of the present invention may also facilitate a reduction in failure rates and production costs of field emission arrays.

Although the foregoing description contains many specifics and examples, these should not be construed as limiting the scope of the present invention, but merely as providing illustrations of some of the presently preferred embodiments. Similarly, other embodiments of the invention may be devised which do not depart from the spirit or scope of the present invention. The scope of this invention is, therefore, indicated and limited only by the appended claims and their legal equivalents, rather than by the foregoing description. All additions, deletions and modifications to the invention as disclosed herein and which fall within the meaning of the claims are to be embraced within their scope.

What is claimed is:

1. A method for fabricating a field emission array, comprising:

disposing a first layer comprising conductive material over a substrate;

defining a plurality of distinct conductive structures from said first layer, said substrate being exposed between adjacent conductive structures;

disposing a second layer comprising semiconductive or conductive material over said conductive structures;

disposing a first mask over said second layer, regions of said second layer located substantially over said conductive structures being exposed through said first mask;

removing said regions to expose at least a substantially longitudinal portion of each of said conductive structures;

removing said first mask;

defining resistors and at least one emitter tip over each said resistor from said second layer; and removing at least said substantially longitudinal portion of each of said conductive structures.

2. The method of claim 1, wherein said removing at least said substantially longitudinal portion comprises removing at least a center portion of each of said conductive structures.

3. The method of claim 1, wherein said disposing said first layer comprises physical vapor depositing said conductive material onto said substrate.

4. The method of claim 1, wherein said disposing said first layer comprises chemical vapor depositing said conductive material onto said substrate.

5. The method of claim 1, wherein said defining said plurality of distinct conductive structures comprises selectively disposing said conductive material of said first onto said substrate.

6. The method of claim 1, wherein said defining said plurality of distinct conductive structures comprises patterning said first layer.

7. The method of claim 6, wherein said patterning comprises:

disposing a second mask, including a plurality of apertures, over said first layer; and removing selected portions of said first layer through said plurality of apertures.

8. The method of claim 1, wherein said disposing said second layer comprises physical vapor depositing semiconductive material or conductive material over said conductive structures.

9. The method of claim 1, wherein said disposing said second layer comprises chemical vapor depositing semiconductive material or conductive material over said conductive structure.

10. The method of claim 1, wherein said disposing said first mask comprises physical vapor depositing a mask material over said second layer.

11. The method of claim 1, wherein said disposing said first mask comprises chemical vapor depositing a mask material over said second layer.

12. The method of claim 1, wherein said disposing said first mask comprises spinning a mask material over said second layer comprising.

13. The method of claim 1, wherein said disposing said first mask comprises growing a layer of mask material on said second layer comprising.

14. The method of claim 1, wherein said disposing said first mask comprises planarizing a layer of mask material.

15. The method of claim 14, wherein said planarizing said layer of mask material comprises spinning said layer of mask material onto said second layer.

16. The method of claim 14, wherein said planarizing said layer of mask material comprises chemical-mechanical planarizing said layer of mask material.

17. The method of claim 1, wherein said removing said regions comprises etching said regions.

18. The method of claim 17, wherein said etching comprises dry etching.

19. The method of claim 17, wherein said etching comprises wet etching.

20. The method of claim 1, wherein said removing said first mask comprises chemical-mechanical planarizing said first mask to substantially expose said second.

21. The method of claim 1, wherein said removing said first mask comprises etching said first mask.

22. The method of claim 1, wherein said defining resistors and at least one emitter tip comprises:

disposing a third mask over said second layer; and removing portions of said second layer through said third mask.

23. The method of claim 22, wherein said removing comprises etching portions of said second layer.

24. The method of claim 23, wherein said etching comprises wet etching portions of said second layer.

25. The method of claim 23, wherein said removing comprises isotropically etching portions of said second layer.

26. The method of claim 1, further comprising maintaining a portion of said second layer over at least a peripheral edge of each of said conductive structures.

27. The method of claim 26, wherein said removing at least said substantially longitudinal portion of each of said conductive structures comprises etching said conductive structures.

28. The method of claim 27, wherein said removing at least said substrate substantially port comprises retaining at least said peripheral edge.

29. The method of claim 1, wherein said removing at least said substantially longitudinal portion comprises retaining at least a lateral edge of each of said conductive structures.

30. A method for fabricating emitter tips and their corresponding resistors of a field emission array, comprising:

disposing a first layer comprising conductive material over a substrate;

patterning said first layer to define a plurality of distinct conductive structures, said substrate being exposed between adjacent ones of said plurality of distinct conductive structures;

disposing a second layer comprising semiconductive material or conductive material over said plurality of distinct conductive structures and over exposed regions of said substrate;

disposing a first mask over said second layer;

removing portions of said second layer exposed through said first mask to expose at least a substantially longitudinal portion of each of said plurality of distinct conductive structures through said second layer;

removing said first mask; and removing at least said substantially longitudinal portion of each of said plurality of distinct conductive structures to expose said substrate.

31. The method of claim 30, wherein said disposing said first layer comprises physical vapor depositing conductive material over said substrate.

32. The method of claim 30, wherein said disposing said first layer comprises chemical vapor depositing conductive material over said substrate.

33. The method of claim 30, wherein said patterning said first layer comprises:

disposing a second mask over said first layer; and removing selected portions of said first layer through said second mask.

34. The method of claim 33, wherein said removing selected portions of said first comprises etching said selected portions.

35. The method of claim 30, wherein said patterning said first layer comprises selectively depositing conductive material onto said substrate.

36. The method of claim 30, wherein said disposing said second layer comprises chemical vapor depositing semiconductive material or conductive material over said first layer.

37. The method of claim 30, wherein said disposing said second layer comprises physical vapor depositing semiconductive material or conductive material over said first layer.

38. The method of claim 30, wherein said disposing said first mask comprises growing a layer of mask material on a surface of said second layer.

39. The method of claim 30, wherein said disposing said first mask comprises depositing a layer of mask material over said second layer.

40. The method of claim 39, wherein said depositing comprises physical vapor depositing or chemical vapor depositing.

41. The method of claim 30, wherein said disposing said first mask comprises spinning a layer of mask material over said second layer.

42. The method of claim 30, wherein said disposing said first mask comprises removing raised regions of said layer of mask material over said second layer to expose underlying regions of said second layer therethrough.

43. The method of claim 42, wherein said removing raised regions comprises chemical-mechanical planarizing said layer of mask material.

44. The method of claim 43, wherein said chemical-mechanical planarizing comprises chemical-mechanical polishing.

45. The method of claim 30, wherein said removing portions of said second layer comprises etching portions of said second layer exposed through said first mask.

46. The method of claim 45, wherein said etching comprises wet etching.

47. The method of claim 45, wherein said etching is substantially anisotropic.

48. The method of claim 30, further comprising patterning other portions of said second layer so as to define resistors adjacent said plurality of distnct conductive structures and at least one emitter tip over each resistor.

49. The method of claim 48, wherein said patterning other portions of said second layer comprises:

disposing a second mask over said second layer; and selectively removing said other portions through said second mask.

50. The method of claim 49, wherein said selectively removing said other portions comprises etching said other portions.

51. The method of claim 50, wherein said etching comprises wet etching or dry etching.

52. The method of claim 50, wherein said etching comprises isotropically etching said other portions.

53. The method of claim 30, wherein said removing at least said substantially longitudinal portion of each of said plurality of distinct conductive structures comprises removing at least a center portion of each of said plurality of distinct conductive structures.

54. The method of claim 30, wherein said removing at least said substantially longitudinal portion of each of said plurality of distinct conductive structures comprises retaining at least one lateral edge portion of selected ones of said plurality of distinct conductive structures.

55. The method of claim 30, wherein said removing at least said substantially longitudinal portion of each of said plurality of distinct conductive structures comprises etching each of said plurality of distinct conductive structures.

56. The method of claim 55, wherein said etching comprises etching said plurality of distinct conductive structures with an etchant selective for said conductive material of said plurality of distinct conductive structures over a material of said resistors and emitter tips.

57. The method of claim 55, wherein said etching comprises dry etching or wet etching.

58. The method of claim 55, wherein said etching comprises substantially anisotropically etching said plurality of conductive structures.

59. The method of claim 30, wherein said removing at least said substantially longitudinal portion of each of said plurality of distinct conductive structures comprises substantially anisotropically removing said at least substantially longitudinal portion.

* * * * *

UNITED STATES PATENT AND TRADEMARK OFFICE

CERTIFICATE OF CORRECTION

PATENT NO. : 6,133,057
DATED : October 17, 2000
INVENTOR(S) : Ammar Derraa

It is certified that error appears in the above-identified patent and that said Letters Patent is hereby corrected as shown below:

<u>Column 9,</u>
Line 20, after “first” and before “onto” insert -- layer --
Line 38, change “structure” to -- structures --
Line 47, after “layer” delete “comprising”
Line 50, after “layer” delete “comprising”
Line 67, after “second” and before the period insert -- layer --

<u>Column 10,</u>
Line 23, change “port” to -- longitudinal portion --
Line 63, after “first” and before “comprises” insert -- layer --

<u>Column 11,</u>
Line 38, change “distnct” to -- distinct --

<u>Column 12,</u>
Line 33, after “of” at the end of the line insert -- distinct --

Signed and Sealed this

Twenty-second Day of April, 2003

JAMES E. ROGAN
*Director of the United States Patent and Trademark Office*